US007242252B2

(12) United States Patent
Taylor

(10) Patent No.: US 7,242,252 B2
(45) Date of Patent: Jul. 10, 2007

(54) TRANSISTOR BIAS CURRENT REGULATION APPARATUS, METHOD, AND SYSTEM

(75) Inventor: Stewart S. Taylor, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 219 days.

(21) Appl. No.: 11/092,346

(22) Filed: Mar. 29, 2005

(65) Prior Publication Data

US 2006/0220731 A1 Oct. 5, 2006

(51) Int. Cl.
*H03F 3/04* (2006.01)

(52) U.S. Cl. ........................ 330/296; 330/285; 330/300

(58) Field of Classification Search ................ 330/285, 330/300, 296
See application file for complete search history.

(56) References Cited

U.S. PATENT DOCUMENTS

| | | | | |
|---|---|---|---|---|
| 5,034,702 | A * | 7/1991 | Ueda | 330/277 |
| 6,043,714 | A * | 3/2000 | Yamamoto et al. | 330/296 |
| 6,437,647 | B1 * | 8/2002 | Fowler | 330/288 |
| 6,731,173 | B1 * | 5/2004 | Thompson | 330/296 |
| 6,784,748 | B1 * | 8/2004 | Canyon et al. | 330/296 |
| 7,064,614 | B2 * | 6/2006 | Feng et al. | 330/296 |

* cited by examiner

*Primary Examiner*—Patricia Nguyen
(74) *Attorney, Agent, or Firm*—LeMoine Patent Services, PLLC; Dana B. LeMoine

(57) ABSTRACT

A biased transistor circuit utilizes a transistor that exhibits a change in threshold voltage as the drain-to-source voltage changes due to power supply voltage changes. A bias circuit senses the power supply voltage changes and modifies a gate bias voltage on the transistor to maintain a substantially constant drain bias current in the transistor.

18 Claims, 4 Drawing Sheets

TRANSISTOR BIAS CURRENT REGULATION APPARATUS, METHOD, AND SYSTEM

FIELD

The present invention relates generally to transistor circuits, and more specifically to bias current regulation in transistor circuits.

BACKGROUND

In some applications, transistors may be "biased" to operate in a particular fashion. For example, a field effect transistor (FET) may have a "bias current" that continuously flows between two device terminals such as source and drain nodes of the transistor. If the drain-to-source voltage across the transistor changes, the bias current may change.

Circuit designers typically design transistor circuits to satisfy certain constraints such as size, cost, performance, and power consumption. If the bias current changes beyond certain limits due to changes in drain-to-source voltage, the design constraints may not be satisfied.

DESCRIPTION OF EMBODIMENTS

Figure 1:
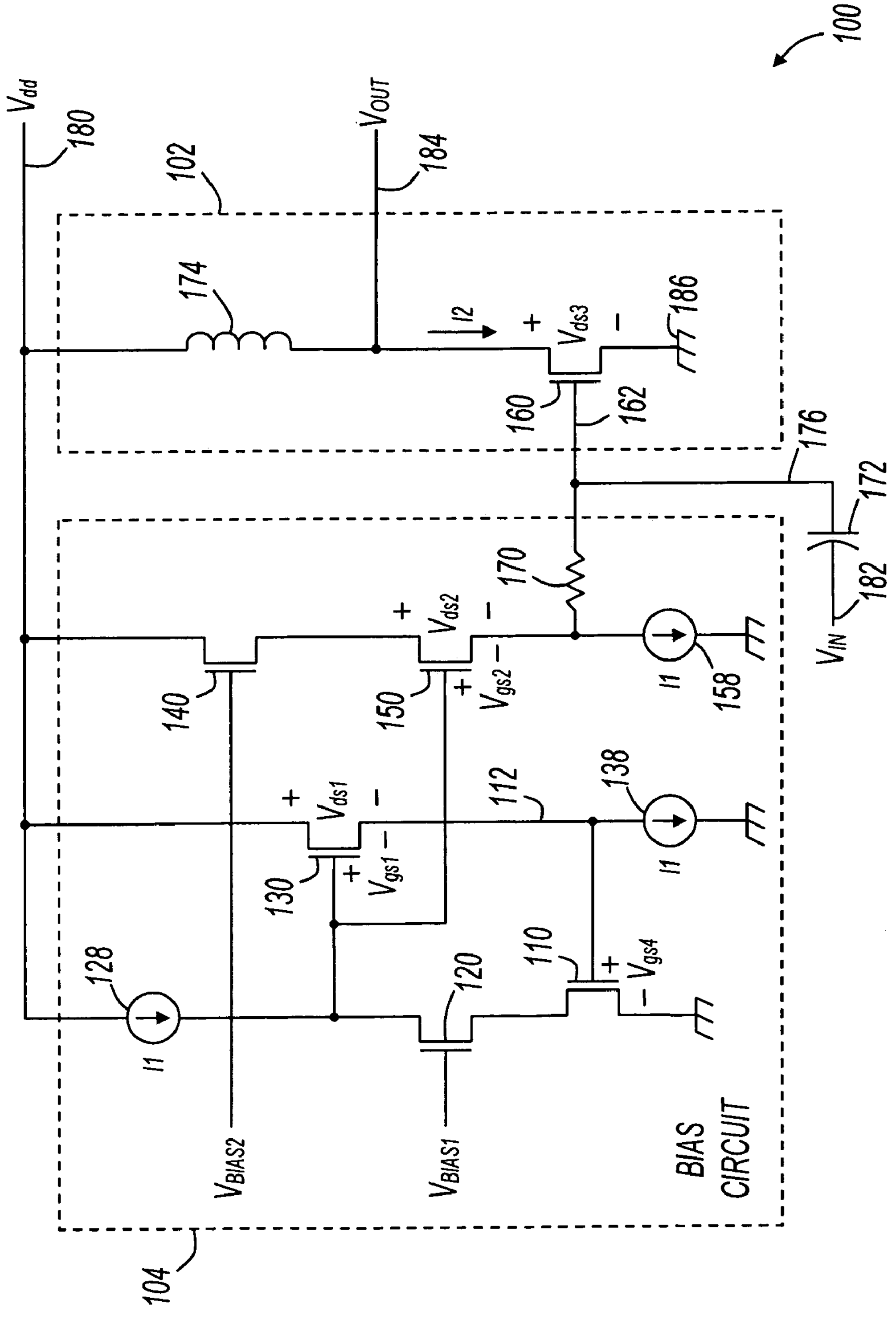
FIGS. 1 and 2 show diagrams of biased transistor circuits.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a diagram of a biased transistor circuit. Circuit 100 includes biased transistor circuit 102 and bias circuit 104. In embodiments represented by FIG. 1, biased transistor circuit 102 operates as an amplifier circuit that receives an input signal on node 182 and provides an output signal on node 184. Blocking capacitor 172 couples the input signal $V_{IN}$ on node 182 to the gate node of transistor 160. In some embodiments, capacitor 172 is replaced by a matching network having a particular frequency response. For example, a matching network may be utilized for narrow-band amplifiers for radio frequency (RF) applications. Bias circuit 104 provides a bias voltage to transistor circuit 102 on node 176.

Biased transistor circuit 102 includes transistor 160 and inductor 174. As shown in FIG. 1, transistor 160 is an output transistor of an amplifier. Transistor 160 includes a source node coupled to reference node 186, and also includes a drain node coupled to power supply node 180 through inductor 174, which has little or no direct current (DC) voltage drop. As used herein, the term "power supply node" refers to a single circuit node. Power supply node 180 is shown having a voltage $V_{DD}$. In operation, $V_{DD}$ may change. For example, $V_{DD}$ may be provided by a battery having a varying voltage as the battery discharges. Further, $V_{DD}$ may reach a higher voltage when a battery charger is coupled to the circuit to charge a battery. Transistor 160 has a drain-to-source voltage ($V_{ds3}$) that varies as $V_{DD}$ varies.

If the gate voltage of transistor 160 is held constant, the drain bias current ($I_2$) may vary as $V_{DD}$ varies. For example, transistor 160 may be a short channel transistor that is subject to varying drain current with varying drain-to-source voltage due to drain induced barrier lowering (DIBL) and/or channel length modulation. Variations in drain bias current may detrimentally affect circuit performance (gain, linearity, noise performance, etc.) and/or increase power dissipation. In various embodiments of the present invention, bias circuit 104 dynamically modifies the gate bias voltage of transistor 160 as $V_{DD}$ varies in order to maintain a substantially constant drain bias current in transistor 160.

Bias circuit 104 includes transistors 110, 120, 130, 140, and 150, current sources 128, 138, and 158, and resistor 170. Current source 128 establishes the drain currents of transistors 110 and 120 as $I_1$; current source 138 establishes the drain current of transistor 130 as $I_1$; and current source 158 establishes the drain currents of transistors 140 and 150 as $I_1$. Although current sources 128, 138, and 158 are all shown sourcing a current of $I_1$, this is not a limitation of the present invention. The currents in the various branches of bias circuit 104 may be scaled, and the dimensions of the various transistors of bias circuit 104 may also be scaled without departing from the scope of the present invention.

Transistor 110 has a drain current $I_1$ by virtue of being coupled to current source 128, and transistor 120 is coupled to transistor 110 as a cascode transistor to provide a fairly constant drain voltage on transistor 110. The gate-to-source voltage of transistor 110 ($V_{gs4}$) is used in conjunction with other developed voltages in the circuit to control the gate bias voltage for transistor 160.

Transistor 130 is a sensing transistor having a drain node coupled to power supply node 180. As the voltage on power supply node 180 varies, the drain-to-source voltage ($V_{ds1}$) on transistor 130 also varies. For example, $V_{ds1}$ increases as $V_{DD}$ increases and $V_{ds1}$ decreases as $V_{DD}$ decreases. For a fixed drain current, the gate-to-source voltage ($V_{gs1}$) of transistor 130 will also vary as the voltage on power supply node 180 varies due to channel length modulation and drain induced barrier lowering. These phenomena cause the threshold voltage ($V_T$) of transistor 130 to change with varying drain voltage, and for a fixed drain bias current, this results in $V_{gs}$ varying with drain voltage. For example, as $V_{DD}$ increases, $V_{ds1}$ increases, and $V_T$ becomes more negative, reducing $V_{gs1}$ for a fixed drain bias current ($I_1$). Also for example, as $V_{DD}$ decreases, $V_{ds1}$ decreases, and $V_T$ becomes more positive, increasing $V_{gs1}$ for a fixed drain bias current ($I_1$).

Changes in $V_{gs1}$ due to changes in $V_{DD}$ are substantially the same as changes to the threshold voltage of transistor 160 because transistors 130 and 160 have matching characteristics. Matching characteristics may be obtained by placing transistors 130 and 160 near each other on the same integrated circuit die and operating them at similar temperatures.

Transistor 150 is coupled as a source follower or buffer transistor that offsets the nominal value of $V_{gs1}$ to provide the nominal as well as the variable $V_{gs}$ for transistor 160 to achieve the substantially constant drain bias current in transistor 160. The gate-to-source voltage of transistor 150 ($V_{gs2}$) is held substantially constant by providing a substantially constant drain current and drain-to-source voltage ($V_{ds2}$) on buffer transistor 150. The drain-to-source voltages of transistor 110 ($V_{ds4}$) and transistor 150 ($V_{ds2}$) are set using $V_{BIAS1}$ and $V_{BIAS2}$, respectively. $V_{BIAS1}$ and $V_{BIAS2}$ may be generated using any circuit capable of producing a suitable voltage.

The source of buffer transistor 150 is coupled to provide a bias voltage to the gate of transistor 160 through resistor 170. Resistor 170 presents a high impedance to the gate of transistor 160. In some embodiments, resistor 170 may be replaced by a choke (large inductor).

In operation, bias circuit 104 provides a transistor gate bias voltage that varies in response to power supply voltage variations. The dynamic bias voltage biases a transistor to provide a substantially constant drain bias current in the presence of power supply voltage variations, which change $V_{ds}$ of FET transistors such as MOSFETs. Bias circuit 104 may be utilized in circuits such as low noise amplifiers (LNAs) and power amplifiers (PA) where a particular bias point (sweet spot bias) is desired, and a shift in bias current would detrimentally affect circuit performance and/or increase power dissipation.

Figure 2:
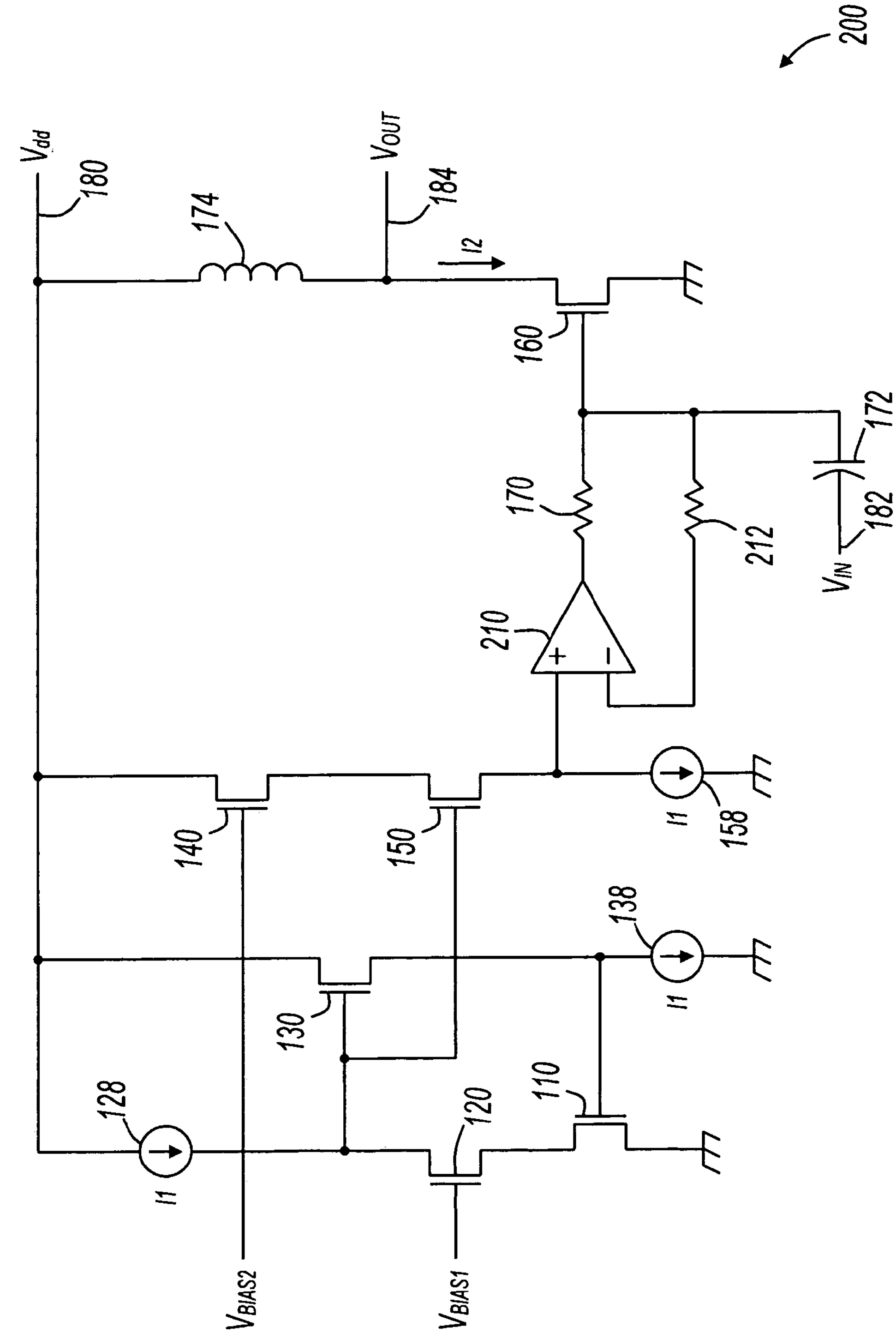

FIG. 2 shows a diagram of a biased transistor circuit. Circuit 200 is similar to circuit 100 (FIG. 1) with the addition of feedback amplifier 210 in series with resistor 170, connected as a voltage follower. Amplifier 210 additionally employs isolating resistor 212 from its output to its inverting input. This feedback amplifier, in conjunction with resistors 170 and 212, provides a low impedance at the gate of transistor 160 at low and moderate frequencies (modulation bandwidth), and a high impedance at high frequencies (typically, RF frequencies). In some cases, this further improves linearity while maintaining high gain and an impedance match at the operating frequency. It may also facilitate supplying gate current to transistor 160 if gate tunneling current is significant, without shifting the bias point. For example, when circuit 200 is a power amplifier, transistor 160 may be very large and may have significant gate current.

FIGS. 1 and 2 show bias current regulation in a transistor circuit that performs amplification, but this is not a limitation of the present invention. For example, the bias circuits shown may be utilized to maintain substantially constant drain bias currents in oscillator circuits, mixer circuits, digital circuits, or any other type of transistor circuits.

The transistors shown in FIGS. 1 and 2 are shown as field effect transistors, and specifically as N-type metal oxide semiconductor field effect transistors (MOSFETs). Other types of switching or amplifying elements may be utilized for the various transistors of circuits 100 or 200 without departing from the scope of the present invention. For example, the transistors of circuits 100 and 200 may be P-type MOSFETs, junction field effect transistors (JFETs), metal semiconductor field effect transistors (MESFETs), or any device capable of performing as described herein.

Figure 3:
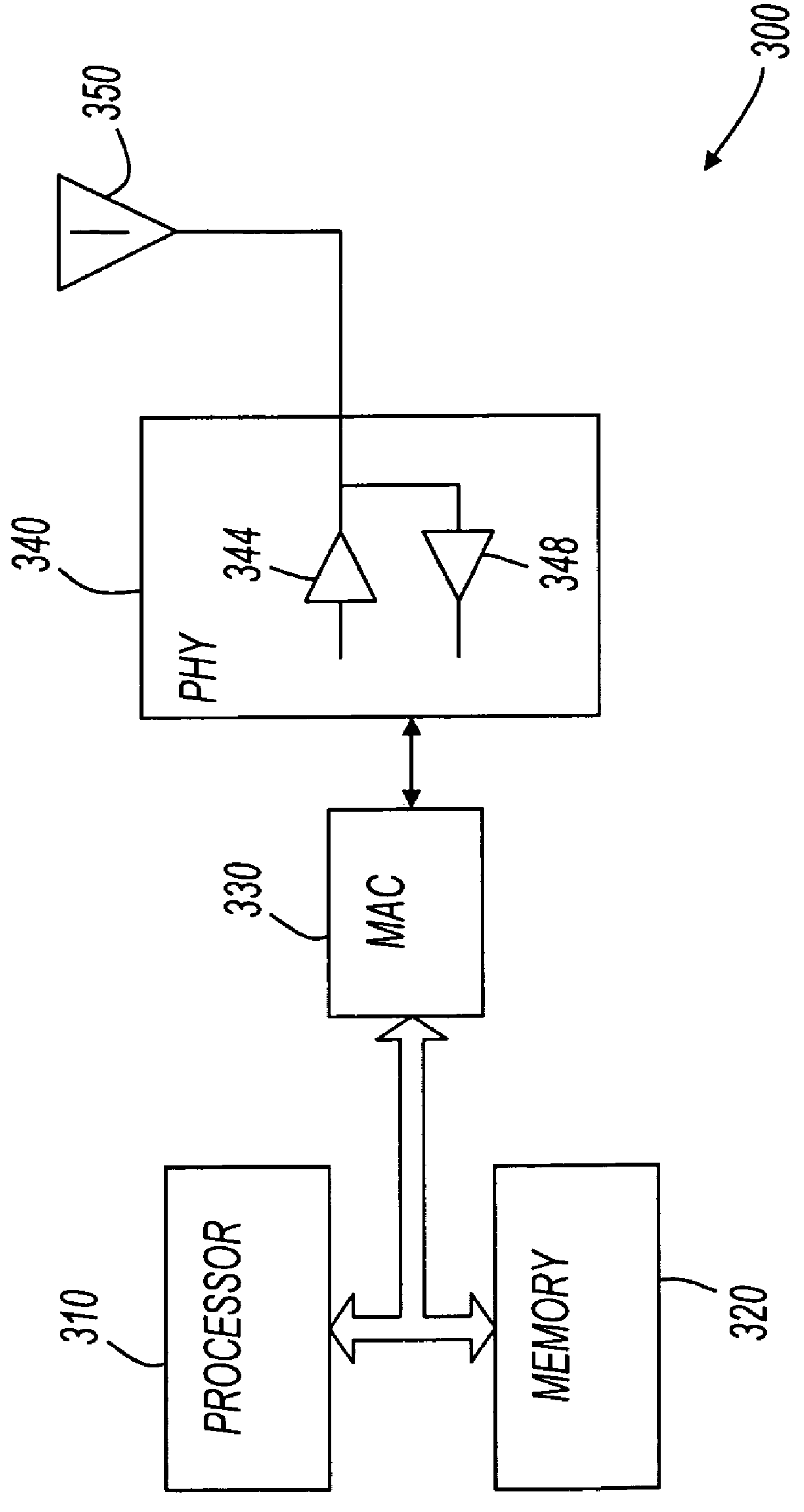
FIG. 3 shows a diagram of an electronic system in accordance with various embodiments of the present invention.

FIG. 3 shows a system diagram in accordance with various embodiments of the present invention. Electronic system 300 includes antenna 350, physical layer (PHY) 340, media access control (MAC) layer 330, processor 310, and memory 320. In operation, system 300 sends and receives signals using antenna 350, and the signals are processed by the various elements shown in FIG. 3.

Antenna 350 may include one or more antennas. For example, antenna 350 may include a single directional antenna or an omni-directional antenna. As used herein, the term omni-directional antenna refers to any antenna having a substantially uniform pattern in at least one plane. For example, in some embodiments, antenna 350 may include a single omni-directional antenna such as a dipole antenna, or a quarter wave antenna. Also for example, in some embodiments, antenna 350 may include a single directional antenna such as a parabolic dish antenna or a Yagi antenna. In still further embodiments, antenna 350 may include multiple physical antennas. For example, in some embodiments, multiple antennas are utilized for multiple-input-multiple-output (MIMO) processing or spatial-division multiple access (SDMA) processing.

Physical layer (PHY) 340 is coupled to antenna 350 to interact with other wireless devices. PHY 340 may include circuitry to support the transmission and reception of radio frequency (RF) signals. For example, as shown in FIG. 3, PHY 340 includes power amplifier (PA) 344 and low noise amplifier (LNA) 348. Either or both of PA 344 and LNA 348 may include a biased transistor circuit and a bias circuit such as those described above with reference to FIGS. 1 and 2. In some embodiments, PHY 340 includes additional functional blocks to perform filtering, frequency conversion or the like.

PHY 340 may be adapted to transmit/receive and modulate/demodulate signals of various formats and at various frequencies. For example, PHY 340 may be adapted to receive time domain multiple access (TDMA) signals, code domain multiple access (CDMA) signals, global system for mobile communications (GSM) signals, orthogonal frequency division multiplexing (OFDM) signals, multiple-input-multiple-output (MIMO) signals, spatial-division multiple access (SDMA) signals, or any other type of communications signals. The various embodiments of the present invention are not limited in this regard.

Example systems represented by FIG. 3 include cellular phones, personal digital assistants, wireless local area network interfaces, and the like. Many other systems uses for bias circuits and biased transistor circuits exist. For example, PA 344 may be used in a desktop computer, a network bridge or router, or any other system without an antenna.

Media access control (MAC) layer 330 may be any suitable media access control layer implementation. For example, MAC 330 may be implemented in software, or hardware or any combination thereof. In some embodiments, a portion of MAC 330 may be implemented in hardware, and a portion may be implemented in software that is executed by processor 310. Further, MAC 330 may include a processor separate from processor 310.

Processor 310 may be any type of processor capable of communicating with memory 320, MAC 330, and other functional blocks (not shown). For example, processor 310 may be a microprocessor, digital signal processor (DSP), microcontroller, or the like.

Memory 320 represents an article that includes a machine readable medium. For example, memory 320 represents a random access memory (RAM), dynamic random access memory (DRAM), static random access memory (SRAM), read only memory (ROM), flash memory, or any other type of article that includes a medium readable by processor 310. Memory 320 may store instructions for performing software driven tasks. Memory 320 may also store data associated with the operation of system 300.

Although the various elements of system 300 are shown separate in FIG. 3, embodiments exist that combine the circuitry of processor 310, memory 320, MAC 330, and all or a portion of PHY 340 in a single integrated circuit. For example, MAC 330 and PA 344 may be combined together on an integrated circuit die. In some embodiments, the various elements of system 300 may be separately packaged and mounted on a common circuit board. In other embodiments, the various elements are separate integrated circuit dice packaged together, such as in a multi-chip module, and in still further embodiments, various elements are on the same integrated circuit die.

Bias circuits, biased transistor circuits, and other embodiments of the present invention can be implemented in many ways. In some embodiments, they are implemented in integrated circuits as part of electronic systems. In some embodiments, design descriptions of the various embodiments of the present invention are included in libraries that enable designers to include them in custom or semi-custom designs. For example, any of the disclosed embodiments can be implemented in a synthesizable hardware design language, such as VHDL or Verilog, and distributed to designers for inclusion in standard cell designs, gate arrays, or the like. Likewise, any embodiment of the present invention can also be represented as a hard macro targeted to a specific manufacturing process. For example, portions of bias circuit 104 (FIG. 1) may be represented as polygons assigned to layers of an integrated circuit.

Figure 4:
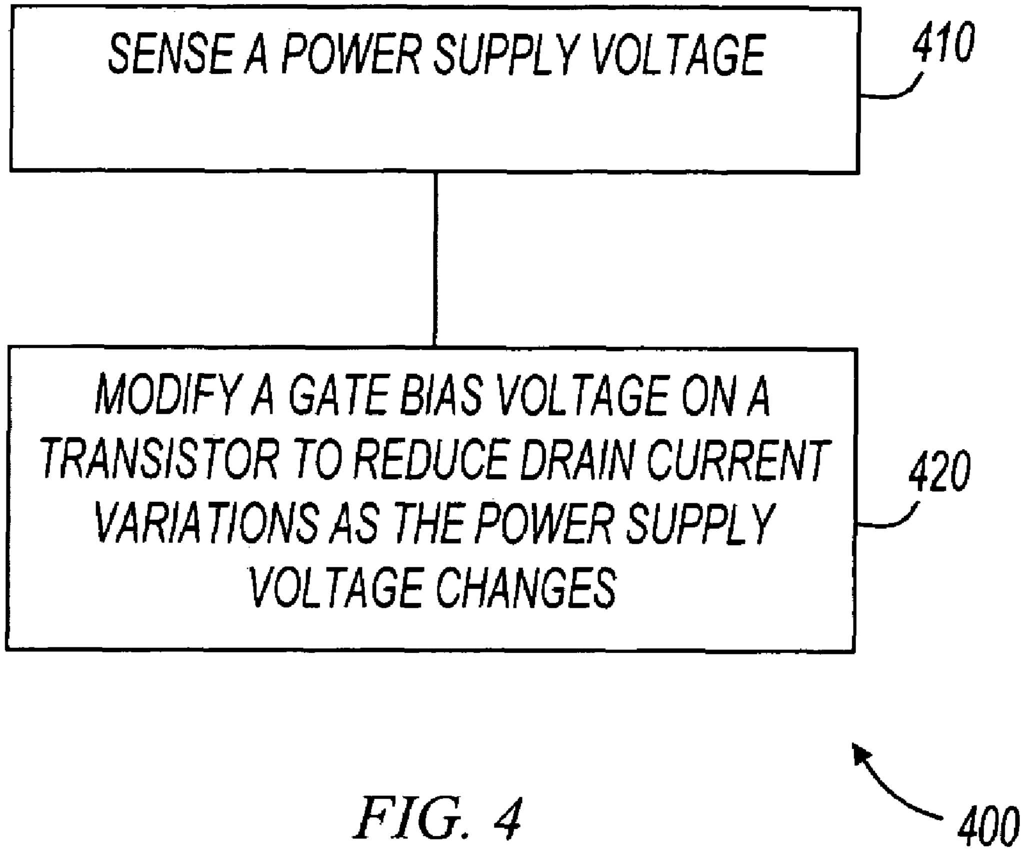
FIG. 4 shows a flowchart in accordance with various embodiments of the present invention.

FIG. 4 shows a flowchart in accordance with various embodiments of the present invention. In some embodiments, method 400, or portions thereof, is performed by a bias circuit, embodiments of which are shown in previous figures. In other embodiments, method 400 is performed by an amplifier, an integrated circuit, or an electronic system. Method 400 is not limited by the particular type of apparatus performing the method. The various actions in method 400 may be performed in the order presented, or may be performed in a different order. Further, in some embodiments, some actions listed in FIG. 4 are omitted from method 400.

Method 400 is shown beginning with block 410 in which a power supply voltage is sensed. In some embodiments, this corresponds to a transistor having a drain node coupled to a power supply node, such as transistor 130 (FIG. 1), experiencing a change in gate-to-source voltage as a result of a power supply voltage variation. Further, the sensing transistor may have a substantially constant drain current.

At 420, a transistor gate bias voltage is modified to reduce drain current variations as the power supply voltage changes. In some embodiments, this may correspond to providing a voltage developed on a gate node of the sensing transistor to a gate node of a buffer transistor that has a substantially constant gate-to-source voltage, and using a voltage developed on a source node of the buffer transistor to modify the transistor gate bias voltage.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. A circuit comprising:

a first transistor having a drain node coupled to a power supply node, and a gate node coupled to receive a bias voltage;

a bias network to modify the bias voltage as a voltage on the power supply node changes to maintain a substantially constant drain current in the first transistor, wherein the bias network comprises a first current source and a sensing transistor having a source node coupled to the current source to provide a substantially constant drain current to the sensing transistor, having a drain node coupled to the power supply node, and having a gate node coupled to influence the bias voltage on the gate node of the first transistor;

a buffer transistor having a gate node coupled to the gate node of the sensing transistor, and having a source node coupled to provide the bias voltage to the gate node of the first transistor; and a feedback amplifier coupled between the source node of the buffer transistor and the gate node of the first transistor.

2. The circuit of claim 1 further comprising a second current source coupled to a source node of the buffer transistor to provide a substantially constant drain current in the buffer transistor.

3. The circuit of claim 1 further comprising a cascode transistor coupled between the buffer transistor and the power supply node.

4. The circuit of claim 1 wherein the first transistor comprises a field effect transistor (FET).

5. The circuit of claim 1 wherein the first transistor comprises a metal oxide semiconductor field effect transistor (MOSFET).

6. The circuit of claim 1 wherein the sensing transistor has characteristics that substantially match characteristics of the first transistor.

7. The circuit of claim 1 wherein the first transistor is an output transistor of a power amplifier.

8. An amplifier circuit comprising:

an output transistor subject to varying drain current with varying drain-to-source voltage;

a bias circuit to dynamically modify a gate-to-source bias voltage on the output transistor to reduce drain current variations when the drain-to-source voltage changes on the output transistor, wherein the bias circuit comprises a sensing transistor having a substantially constant drain current, the sensing transistor having a drain node coupled to a power supply node to sense power supply voltage changes;

a buffer transistor, the buffer transistor having a gate node coupled to a gate node of the sensing transistor, and having a source node coupled to a gate node of the output transistor; and a feedback amplifier coupled between the source node of the buffer transistor and the gate node of the output transistor.

9. The amplifier circuit of claim 8 further comprising a cascode transistor coupled between the buffer transistor and the power supply node.

10. A method of regulating a bias current in a transistor comprising:

sensing a power supply voltage, wherein sensing a power supply voltage comprises providing a substantially constant drain current through a sensing transistor that has a drain node coupled to a node having the power supply voltage; and modifying a gate bias voltage on the transistor to reduce drain current variations as the power supply voltage changes, wherein modifying a gate bias voltage comprises providing a voltage developed on a gate node of the sensing transistor to a gate node of a buffer transistor that has a substantially constant gate-to-source voltage, and using a voltage developed on a source node of the buffer transistor to modify the gate bias voltage on the transistor with a feedback amplifier.

11. A system comprising:

an omni-directional antenna; and an amplifier circuit coupled to drive a signal on the antenna, the amplifier having an output transistor subject to varying drain current with varying drain-to-source voltage, and a bias circuit to dynamically modify a gate-to-source bias voltage on the output transistor to reduce drain current variations when the drain-to-source voltage changes on the output transistor;

wherein the bias circuit comprises a sensing transistor having a substantially constant drain current, the sensing transistor having a drain node coupled to a power supply node to sense power supply voltage changes, a buffer transistor, the buffer transistor having a gate node coupled to a gate node of the sensing transistor, and having a source node coupled to a gate node of the output transistor, and a cascode transistor coupled between the buffer transistor and the power supply node.

12. The amplifier circuit of claim 8 wherein the output transistor comprises a field effect transistor (FET).

13. The amplifier circuit of claim 8 wherein the output transistor comprises a metal oxide semiconductor field effect transistor (MOSFET).

14. The amplifier circuit of claim 8 wherein the sensing transistor has characteristics that substantially match characteristics of the output transistor.

15. The system of claim 11 wherein the output transistor comprises a field effect transistor (FET).

16. The system of claim 11 wherein the output transistor comprises a metal oxide semiconductor field effect transistor (MOSFET).

17. The system of claim 11 wherein the sensing transistor has characteristics that substantially match characteristics of the output transistor.

18. The system of claim 11 wherein the bias circuit further comprises a feedback amplifier coupled between the source node of the buffer transistor and the gate node of the output transistor.

* * * * *